United States Patent
Liou et al.

(10) Patent No.: US 12,080,547 B2
(45) Date of Patent: Sep. 3, 2024

(54) INTERCONNECT SYSTEM WITH IMPROVED LOW-K DIELECTRICS

(71) Applicant: Taiwan Semiconductor Manufacturing Co., Ltd., Hsinchu (TW)

(72) Inventors: Joung-Wei Liou, Hsinchu (TW); Yu Lun Ke, Hsinchu (TW); Yi-Wei Chiu, Kaohsiung (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 62 days.

(21) Appl. No.: 17/350,792

(22) Filed: Jun. 17, 2021

(65) Prior Publication Data

US 2021/0313174 A1  Oct. 7, 2021

Related U.S. Application Data

(62) Division of application No. 16/449,160, filed on Jun. 21, 2019, now Pat. No. 11,043,373.

(60) Provisional application No. 62/712,345, filed on Jul. 31, 2018.

(51) Int. Cl.
*H01L 21/02* (2006.01)
*H01L 21/768* (2006.01)

(52) U.S. Cl.
CPC ........... *H01L 21/02164* (2013.01); *H01L 21/02205* (2013.01); *H01L 21/02211* (2013.01); *H01L 21/0228* (2013.01); *H01L 21/76802* (2013.01); *H01L 21/76877* (2013.01)

(58) Field of Classification Search
None
See application file for complete search history.

(56) References Cited

U.S. PATENT DOCUMENTS

| | | | |
|---|---|---|---|
| 9,754,822 B1 * | 9/2017 | Chou | H01L 23/5226 |
| 2004/0253378 A1 * | 12/2004 | Schmitt | H01L 21/02216 427/255.28 |
| 2006/0091559 A1 | 5/2006 | Nguyen et al. | |
| 2009/0096106 A1 | 4/2009 | Vrtis et al. | |
| 2009/0140418 A1 | 6/2009 | Li et al. | |
| 2011/0042789 A1 * | 2/2011 | Nakagawa | H01L 21/31633 257/E23.116 |
| 2011/0206857 A1 | 8/2011 | Yim et al. | |
| 2012/0282415 A1 * | 11/2012 | Vrtis | C23C 30/00 106/287.14 |

(Continued)

*Primary Examiner* — Asok K Sarkar
(74) *Attorney, Agent, or Firm* — Slater Matsil, LLP

(57) ABSTRACT

Methods to form low-k dielectric materials for use as intermetal dielectrics in multilevel interconnect systems, along with their chemical and physical properties, are provided. The deposition techniques described include PECVD, PEALD, and ALD processes where the precursors such as TEOS and MDEOS may provide the requisite O-atoms and $O_2$ gas may not be used as one of the reactants. The deposition techniques described further include PECVD, PEALD, and ALD processes where $O_2$ gas may be used and, along with the $O_2$ gas, precursors containing embedded Si—O—Si bonds, such as $(CH_3O)_3$—Si—O—Si—$(CH_3O)_3$) and $(CH_3)_3$—Si—O—Si—$(CH_3)_3$ may be used.

20 Claims, 15 Drawing Sheets

(56) References Cited

U.S. PATENT DOCUMENTS

| | | | |
|---|---|---|---|
| 2012/0329269 A1* | 12/2012 | Arnold | H01L 21/02274 |
| | | | 438/643 |
| 2015/0028491 A1 | 1/2015 | Angyal et al. | |
| 2018/0122632 A1* | 5/2018 | Vrtis | H01L 21/02216 |
| 2018/0233398 A1* | 8/2018 | Van Cleemput | ............................ |
| | | | H01L 21/02274 |
| 2019/0027357 A1 | 1/2019 | Girard et al. | |

\* cited by examiner

INTERCONNECT SYSTEM WITH IMPROVED LOW-K DIELECTRICS

PRIORITY CLAIM AND CROSS-REFERENCE

This application is a division of U.S. patent application Ser. No. 16/449,160, filed on Jun. 21, 2019 which claims the benefit of U.S. Provisional Application No. 62/712,345, filed on Jul. 31, 2018, which applications are hereby incorporated herein by reference.

BACKGROUND

The semiconductor industry continues to increase the density of electronic components (e.g., transistors, diodes, resistors, capacitors, etc.) and interconnect features (e.g., contacts, vias, lines, bond pads etc.) in integrated circuits (ICs) by innovations in semiconductor technology such as, multiple patterning to reduce the minimum size of features (e.g., lines, spaces, and holes), three-dimensional (3D) transistors (e.g., the fin field-effect transistor (FinFET)), more interconnect levels, and embedding electronic components within the interconnect system stacked above the semiconductor substrate. Scaling to smaller dimensions increases the intrinsic speed of electronic components and enables higher functionality of integrated circuits for any given cost. However, scaling down dimensions often presents new challenges such as, isolation, leakage, reliability, parasitic series resistances, and parasitic coupling capacitances.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

DETAILED DESCRIPTION

Figure 1A:
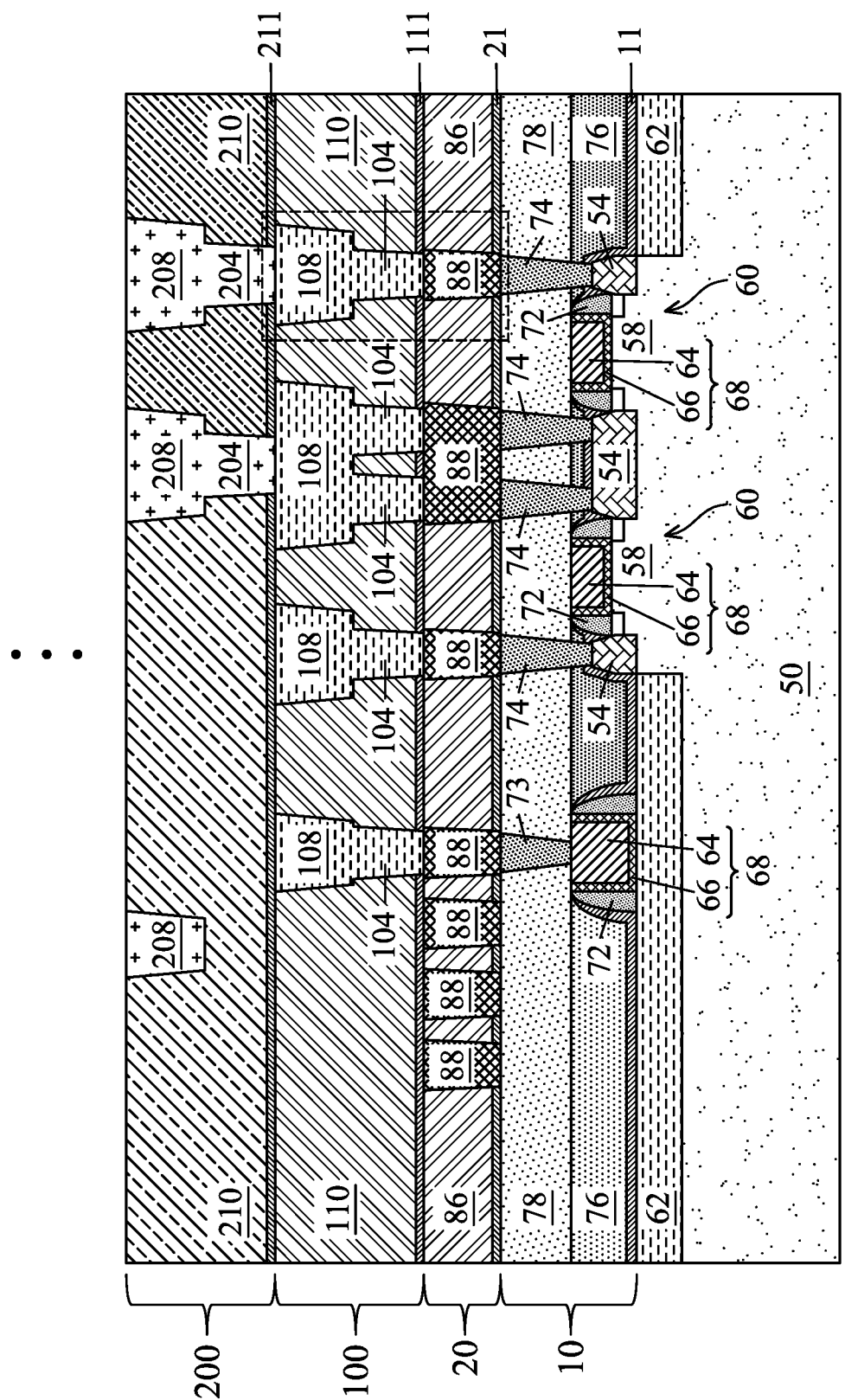
FIG. 1A illustrates a cross-sectional view of a semiconductor substrate and multilevel interconnect structures of an integrated circuit, in accordance with some embodiments.

The following disclosure provides many different embodiments, or examples, for implementing different features of the invention. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

The present disclosure describes embodiments of low dielectric constant (or low-k) insulation layers used to form interlayer dielectrics (ILD) and intermetal dielectrics (IMD) in a multilevel interconnect system comprising conductive lines, contacts, and vias used to interconnect electronic devices and distribute electrical power and signals in an integrated circuit, as specified by a circuit design. FIG. 1A illustrates conductive interconnect structures embedded in dielectric layers formed over a semiconductor substrate on which electronic devices, such as FinFET 60 (shown at the right side in FIG. 1A), may be formed. Conductive elements, referred to as contacts 74, are shown making electrical connections to the source/drain regions (or source/drains) 54. A contact 73 is shown making electrical connection to the gate electrode (or gate) 64. The gate 64 shown at the left side of FIG. 1A may be connected to an electronic device (e.g., a FinFET, a MOS capacitor, a metal-insulator-metal (MIM) capacitor, or a resistor, or the like) not visible in the cross-sectional view of FIG. 1A. The contacts 73 and 74 may extend vertically through one or more dielectric layers (e.g., a first interlayer dielectric ($ILD_1$) 76 and a second interlayer dielectric ($ILD_2$) 78, collectively referred to as ILD 10, as described in greater detail below. The contacts 73 and 74 connect electronic devices formed on the substrate 50 to conductive elements of a vertically adjacent interconnect level referred to as metal-0 ($M_0$). In FIG. 1A, the contacts 73 and 74 connect to conductive $M_0$ lines 88, in accordance with some embodiments. The vertically adjacent interconnect level above $M_0$ is metal-1 ($M_1$). Vertically conducting elements of $M_1$, referred to as vias $V_1$ 104, are shown electrically connecting the $M_0$ lines 88 below to conductive $M_1$ lines 108 above. Successively higher levels of the interconnect system, referred to as metal-2 ($M_2$), $M_3$, etc., may be stacked in a multilevel interconnect system as indicated by the ellipsis at the top of FIG. 1A. For example, at $M_2$, vias $V_2$ 204 connect $M_1$ lines 108 below to $M_2$ lines 208 above.

As illustrated in FIG. 1A, the conductive features of $M_0$ ($M_0$ lines 88) are embedded in $IMD_0$ 20, the conductive features of $M_1$ (vias $V_1$ 104 and $M_1$ lines 108) are embedded in $IMD_1$ 100, the conductive features of $M_2$ (vias $V_2$ 204 and $M_2$ lines 208) are embedded in $IMD_2$ 200, and so on. As described in greater detail below, the IMD layers may include etch-stop layers (ESL) at the bottom of the respective IMD layer. For example, FIG. 1A shows ESL 21 in $IMD_0$ 20, ESL 111 in $IMD_1$ 100, and ESL 211 in $IMD_2$ 200. The bulk insulating layer of each IMD layer (e.g., bulk $IMD_0$ layer 86, bulk $IMD_1$ layer 110, and bulk $IMD_2$ layer 210) may include dielectric materials referred to as low-k dielectrics. In the embodiments described in this disclosure, a low-k dielectric generally refers to an amorphous insulating material comprising predominantly Si—O bonds, yet having a low dielectric constant (k) relative to that of stoichiometric amorphous $SiO_2$ which has k=3.9.

One performance metric of an interconnect system is the characteristic RC charging/discharging time constant of dense metal lines (constructed at the minimum pitch allowed by the design rules), where R (resistance per unit length) is the normalized parasitic series resistance and C (capacitance per unit length) is the normalized parasitic line-to-line capacitance of densely packed metal lines. The RC time constant limits the bandwidth available to transmit high-speed signals over closely spaced long lines. For example, the RC time constant may restrict the maximum length or maximum density of metal lines that may be used to transmit high frequency analog signals or high data rate digital signals within the integrated circuit. A large RC time constant may cause excessive distortion of high-speed signals during transmission thereby limiting the performance of the integrated circuit. Accordingly, it is advantageous to use low-k dielectrics to form, for example, the bulk IMD layers 86, 110, and 210, because the line-to-line capacitance, C, is directly proportional to the dielectric constant, k, of the insulation material between laterally adjacent lines. The modifications done to the processing steps in order to form low-k dielectrics generally degrade some other material properties (e.g., the dielectric breakdown electric field and/ or the mechanical strength). Accordingly, at a particular level, a low-k dielectric may not be included in forming an insulating layer between conductive features if the impact on circuit performance is not high enough to justify the tradeoffs with other dielectric qualities. For example, ILD 10 of the interconnect system illustrated in FIG. 1A, does not comprise a low-k dielectric.

While the present disclosure discusses aspects of methods of forming low-k dielectric layers in the context of connecting electronic devices, such as the FinFET 60, using an example multilevel interconnect system, other embodiments may utilize aspects of this disclosure with other electronic devices and other multilevel interconnect systems.

The substrate 50 illustrated in FIG. 1A may comprise a bulk semiconductor substrate or a silicon-on-insulator (SOI) substrate. An SOI substrate includes an insulator layer below a thin semiconductor layer which is the active layer of the SOI substrate. The semiconductor of the active layer and the bulk semiconductor generally comprise crystalline silicon, but may include one or more other semiconductor materials such as, germanium, silicon-germanium alloys, compound semiconductors (e.g., GaAs, AlAs, InAs, GaN, AlN, and the like), or their alloys (e.g., $Ga_xAl_{1-x}As$, $Ga_xAl_{1-x}N$, $In_xGa_{1-x}As$ and the like), oxide semiconductors (e.g., ZnO, $SnO_2$, $TiO_2$, $Ga_2O_3$, and the like) or combinations thereof. The semiconductor materials may be doped or undoped. Other substrates that may be used include multi-layered substrates, gradient substrates, or hybrid orientation substrates.

Figure 1C:
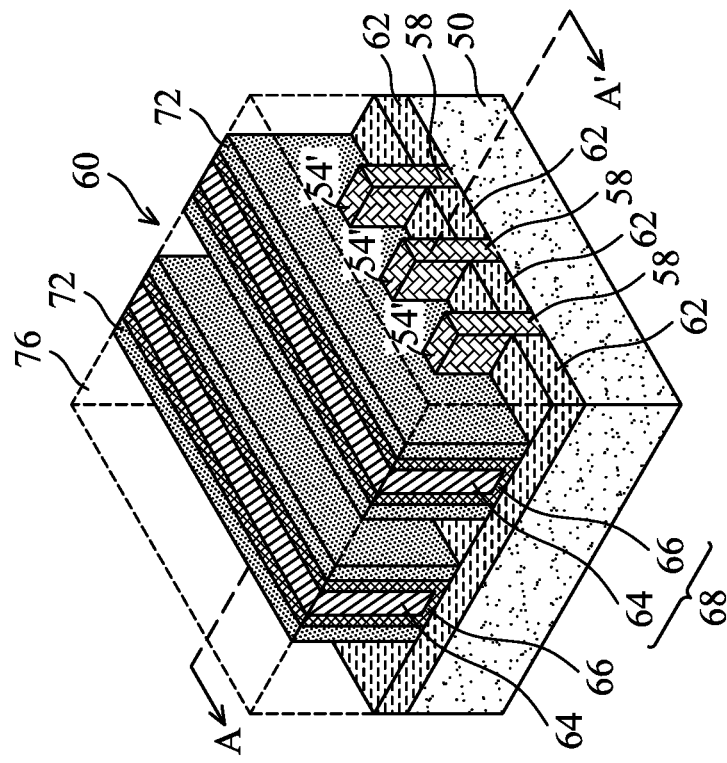
FIGS. 1B and 1C illustrate an example of a FinFET in a three-dimensional view, in accordance with some embodiments.
Figure 1B:
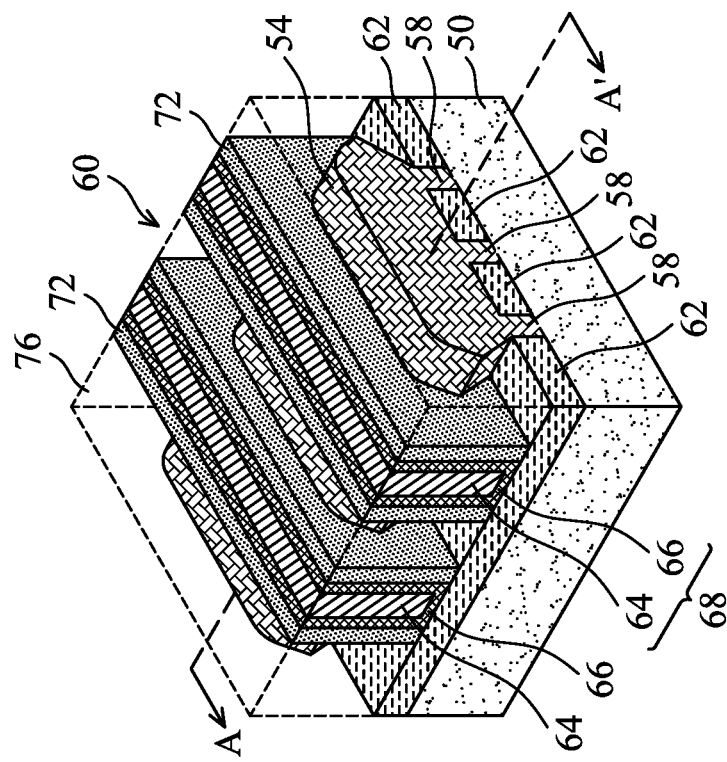

The fin field-effect transistor (FinFET) device 60 illustrated in FIG. 1A is a three-dimensional metal-oxide-semiconductor FET (MOSFET) structure formed in fin-like strips of semiconductor protrusions 58 referred to as fins. FIG. 1B illustrates an example FinFET structure 60 in a three-dimensional (3D) view. The FinFET device 60 comprises two gate structures 68, each gate structure 68 comprising a gate dielectric layer 66 and a gate electrode 64, formed over the sidewalls and top surfaces of three fins 58. The gate structures 68 also extend over the shallow trench isolation (STI) regions 62. The STI regions 62 are formed over a substrate 50, partially filling the recesses outside of the fins 58. Spacers 72 are shown formed along opposing sidewalls of the gate structures 68. The source/drain regions 54 illustrated in FIG. 1B are semiconductor regions formed self-aligned to the spacers 72 using selective epitaxial growth over the fins 58. The source/drain regions 54 are spaced from the gate structures 68 by the spacers 72. In the example illustrated in FIG. 1B, the epitaxial growth over adjacent fins 58 have merged. The protruding structure of fins are better illustrated in the example shown in FIG. 1C wherein the processing steps used to form the epitaxially grown source/drain 54 have been skipped. Accordingly, in FIG. 1C, the source/drain regions of the FinFET 60 are the regions 54' of fins 58. The FinFET structures 60 in FIGS. 1B and 1C are inlaid in an interlayer dielectric (ILD) 76. The methods used to form these structures are described in greater detail below. The cross-section shown in FIG. 1A is taken along a longitudinal axis of a fin 58 in FIG. 1B in a direction parallel to the direction of the current flow between the source/drain regions 54 indicated by the axis A-A'.

The fin 58 may be formed by patterning the substrate using photolithography and etching techniques. For example, a spacer image transfer (SIT) patterning technique may be used. In this method, a sacrificial layer is formed over a substrate and patterned to form mandrels using suitable photolithography and etch processes. Spacers are formed alongside the mandrels using a self-aligned process. The sacrificial layer is then removed by an appropriate selective etch process. Each remaining spacer may then be used as a hard mask to pattern the respective fin 58 by etching a trench into the substrate 50 using, for example, anisotropic reactive ion etching (RIE). FIG. 1A illustrates a single fin 58, although the substrate 50 may comprise any number of fins.

Shallow trench isolation (STI) regions 62 formed along opposing sidewalls of the fin 58 are illustrated in FIG. 1A. STI regions 62 may be formed by depositing one or more dielectric materials (e.g., silicon oxide) to completely fill the trenches around the fins and then recessing the top surface of the dielectric materials. The dielectric materials of the STI regions 62 may be deposited using a high density plasma chemical vapor deposition (HDP-CVD), a low-pressure CVD (LPCVD), sub-atmospheric CVD (SACVD), a flowable CVD (FCVD), spin-on, and/or the like, or a combination thereof. After the deposition, an anneal process or a curing process may be performed. In some cases, the STI regions 62 may include a liner, for example, a thermal oxide liner grown by oxidizing the silicon surface. The recess process may use, for example, a planarization process (e.g., a chemical mechanical polish (CMP)) followed by a selective etch process (e.g., a wet etch, or dry etch, or a combination thereof) that may recess the top surface of the dielectric materials in the STI region 62 such that an upper portion of fins 58 protrudes from surrounding insulating STI regions 62. In some embodiments, the patterned hard mask used to form the fins 58 may also be removed by the planarization process.

In some embodiments, the gate structure 68 of the FinFET device 60 illustrated in FIGS. 1A and 1B is a high-k, metal gate (HKMG) gate structure that may be formed using a replacement gate process flow. In a replacement gate process flow, the HKMG gate structure 68 replaces a sacrificial dummy gate structure (not shown). After forming the STI regions 62, a dummy gate dielectric layer (e.g., silicon oxide, silicon nitride, or the like) and a dummy gate layer (e.g., amorphous silicon, polycrystalline silicon, or the like) are deposited successively using suitable deposition techniques, such as CVD, plasma-enhanced CVD (PECVD), atomic layer deposition (ALD), plasma-enhanced ALD (PEALD) or the like, or by thermal oxidation of the semiconductor surface, or combinations thereof. The dummy gate material may be planarized (e.g., by CMP) and, after planarization, a hard mask layer (e.g., silicon nitride, silicon carbide, or the like) may be formed over the dummy gate layer using, for example, CVD, PVD, PECVD, ALD, PEALD, or the like, or a combination thereof. The dummy gate structure, comprising the dummy gate dielectric, the dummy gate, and the hard mask, is then formed by patterning the hard mask and transferring that pattern to the dummy gate dielectric and dummy gate material using suitable photolithography and etching techniques (e.g., RIE). The dummy gate structure may be formed alongside the sidewalls and tops of the fins 58 protruding above the STI 62 and extend over the surface of the STI regions 62 between the fins 58.

In some embodiments, source/drain regions 54 and spacers 72 of FinFET 60 may be formed self-aligned to the dummy gate structures. Spacers 72 may be formed after patterning the dummy gate structures. A spacer dielectric layer may be deposited using any suitable deposition technique (e.g., CVD, ALD, PVD, or the like, or combinations thereof) and may comprise one or more dielectrics, such as silicon oxide, silicon nitride, silicon oxynitride, silicon carbide, silicon carbonitride, the like, or a combination thereof. The anisotropic etch process removes the spacer dielectric layer from over the top of the dummy gate structures leaving the spacers 72 along the sidewalls of the dummy gate structures extending laterally onto a portion of the surface of the fin (as illustrated in the right side of FIG. 1A) or the surface of the STI dielectric (as illustrated in the left side of FIG. 1A).

Source/drain regions 54 are semiconductor regions in direct contact with the semiconductor fin 58. In some embodiments, the source/drain regions 54 may comprise heavily-doped regions and relatively lightly-doped drain extensions, or LDD regions. Generally, the heavily-doped regions are spaced away from the dummy gate structures using the spacers 72, whereas the LDD regions may be formed prior to forming spacers 72 and, hence, extend under the spacers 72 and, in some embodiments, extend further into a portion of the semiconductor below the dummy gate structure. The LDD regions may be formed, for example, by implanting dopants (e.g., As, P, B, In, or the like) using an ion implantation process.

The source/drain regions 54 may comprise an epitaxially grown region. For example, after forming the LDD regions, the spacers 72 may be formed and, subsequently, the heavily-doped source/drain regions may be formed self-aligned to the spacers 72 by first etching the fins to form recesses, and then depositing a crystalline semiconductor material in the recess by a selective epitaxial growth (SEG) process that may fill the recess and, typically, extend beyond the original surface of the fin to form a raised source-drain structure, as illustrated in FIG. 1A. The crystalline semiconductor material may be elemental (e.g., Si, or Ge, or the like), or an alloy (e.g., $Si_{1-x}C_x$, or $Si_{1-x}Ge_x$, or the like). The SEG process may use any suitable epitaxial growth method (e.g., vapor/solid/liquid phase epitaxy (VPE, SPE, LPE), or metal-organic CVD (MOCVD), or molecular beam epitaxy (MBE), or the like. A high dose (e.g., from about $10^{14}$ cm$^{-2}$ to $10^{16}$ cm$^{-2}$) of dopants may be introduced into the heavily-doped source/drain regions 54 either in situ during SEG, or by an ion implantation process performed after the SEG, or by a combination thereof.

The first interlayer dielectric ($ILD_1$ 76 in FIG. 1A) is deposited to fill the spaces between dummy gate structures (not shown) and between portions of the fins 58 protruding above the STI 62. In some embodiments, a contact etch stop layer (CESL) 11 of a suitable dielectric (e.g., silicon nitride, silicon carbide, or the like, or a combination thereof) may be deposited using a suitable deposition technique (e.g., CVD, PVD, ALD, PECVD, PEALD, or the like) prior to depositing $ILD_1$ 76. A planarization process (e.g., CMP) may be performed to remove excess $ILD_1$ 76 and any remaining hard mask material from over the dummy gates to form a top surface wherein the top surface of the dummy gate material is exposed and may be substantially coplanar (within process variations) with the top surfaces of the $ILD_1$ 76 and the spacers 72. After exposing the top surface of the dummy gate structures, the dummy gate structures may be removed using one or more etching techniques (e.g., wet etching or dry etching, or a combination thereof), thereby creating recesses between respective spacers 72 within which the replacement gate structures are formed, as described below.

In FIG. 1A, HKMG gate structures 68 comprising a gate dielectric layer 66 and a conductive gate layer 64 are shown occupying these recesses. The replacement gate dielectric layer 66 and the replacement conductive gate layer 64 are deposited successively to completely fill the recesses. The gate dielectric layer 66 may comprise one or more dielectric materials, including a high-k dielectric, in accordance with some embodiments. Examples of a high-k dielectric include an oxide or a silicate of Hf, Al, Zr, La, Mg, Ba, Ti, Pb, and combinations thereof. The gate dielectric layer 66 may be formed using any suitable deposition technique such as, CVD, remote plasma CVD (RPCVD), molecular beam deposition (MBD), atomic layer deposition (ALD), or the like.

In some embodiments, the conductive gate layer 64 may be a multilayered metal gate stack comprising a barrier layer, a work function layer, and a gate-fill layer formed successively on top of the gate dielectric layer 66. Example materials for a barrier layer include TiN, TaN, Ti, Ta, or the like, or a multilayered combination thereof. Example materials for a work function layer include TiN, TaN, Ru, Mo, Al, for a pMOS transistor, and Ti, Ag, TaAl, TaAlC, TiAlN, TaC, TaCN, TaSiN, Mn, Zr, for an nMOS transistor. The gate-fill layer which fills the remainder of the recess may comprise metals, such as Cu, Al, W, Co, Ru, or the like, or combinations thereof, or multi-layers thereof. The conductive gate layer 64 may be formed using CVD, RPCVD, PECVD, PVD, ALD, PEALD, electroplating (ECP), electroless plating, or the like.

Excess portions of the gate layer 64 and the gate dielectric layer 66 may be removed from over the top surface of $ILD_1$ 76 using, for example a CMP process. The resulting structure, as illustrated in FIG. 1A, may be a substantially coplanar surface comprising an exposed top surface of $ILD_1$ 76, spacers 72, and remaining portions of the HKMG gate layers 66 and 64 inlaid between respective spacers 72. The example HKMG gate structures 68 (seen on the top of fin 58) illustrated in the right side in FIG. 1A extends, e.g., along sidewalls of and over the portion of fin 58 protruding above the STI 62, as illustrated in the 3D views shown in FIGS. 1B and 1C. The example HKMG gate structure 68 in the left side in FIG. 1A extends over the STI region 62, such as between adjacent fins. The gate electrode 64 may be connected to an electronic device (e.g., a FinFET, a MOS capacitor, a metal-insulator-metal (MIM) capacitor, or a resistor, or the like) not visible in the cross-sectional view of FIG. 1A.

A second interlayer dielectric ($ILD_2$ 78 in FIG. 1A) may be deposited over the $ILD_1$ 76, as illustrated in FIG. 1A. In some embodiments, the insulating materials to form ILD 10 ($ILD_1$ 76 and the $ILD_2$ 78) may comprise silicon oxide, phosphosilicate glass (PSG), borosilicate glass (BSG), boron-doped phosphosilicate glass (BPSG), undoped silicate glass (USG), or the like. The dielectric materials used to form the ILD 10 may be deposited using any suitable method, such as CVD, PECVD, FCVD, spin-on, and/or the like, or a combination thereof. In some embodiments, the $ILD_2$ layer 78 may be planarized using a planarizing process (e.g., CMP).

As illustrated in FIG. 1A, electrical connections to the source/drain regions 54 of the FinFETs 60 may be made by forming contacts 74 extending through the dielectric layers of ILD 10 and CESL 11 over the semiconductor fin 58. A contact 73 extending through $ILD_2$ 78 (shown in the left side in FIG. 1A) illustrates electrical connections made to the gates 64 formed over STI regions 62. In some embodiments, openings for contacts 73 that extend through the $ILD_2$ 78, as well as openings for contacts 74 that extend further, through the $ILD_1$ 76 and the CESL 11 are formed in a single patterning step using suitable photolithography and etching techniques. The etch process may be performed in two successive stages. In the first stage, an anisotropic dry etch process may be used to remove the ILD 10 selectively (selective to the gate electrodes 64 and the CESL 11) to expose portions of the CESL 11 and the conductive gate 64. During the second stage of the etch process, the etchants may be switched to selectively remove the CESL 11 (selective to the gate electrodes 64 and the semiconductor below the CESL 11) to expose the source/drain regions 54. As illustrated in FIG. 1A, the openings for contacts 74 formed over source/drain regions extend deeper than the openings for contacts 73 formed over gates 64.

In some other embodiments, two separate patterning steps may be used to form openings for the two types of contacts 73 and 74. For example, the portions of the surface of ILD 10 where the contacts 73 and 74 would be subsequently formed may be exposed using a first patterned masking layer (e.g., a patterned photoresist layer). An anisotropic etching technique using the gates 64 as an etch-stop layer may be performed with the first patterned mask to remove $ILD_2$ 78 and expose a portion of the top surface of the gates 64. In the exposed regions outside of the gate structures 68, the $ILD_1$ 76 may be substantially retained below the bottom of the openings. These openings in ILD 10 are formed not only over source/drain regions 54 (where source/drain contacts 74 are subsequently formed) but also in portions of the ILD 10 in the space between the gate structures 68 and the semiconductor fins 58. The first pattern may thereby be used to extend the openings for the contacts 73 laterally to form trenches in portions of the ILD 10 beyond the gates 64. The $ILD_1$ 76 remaining below the bottom of these trenches insulate the semiconductor regions 50 and 58 from a conductive material used later to fill the trenches and the contact openings in subsequent processing steps, as described below. The conductive features in the ILD 10 in between device electrodes (e.g., gates 64 and source/drains 54) are used as a local interconnect layer (not shown) to form electrical connections between electronic devices (e.g., FinFETs) over short distances. A second patterned layer (e.g., a photoresist layer) may be used to selectively expose portions of ILD 10 to etchants to complete the removal of ILD 10 and CESL 11 to expose a portion of the source/drain regions 54, thereby completing the openings needed to form source/drain contacts 74.

In some embodiments, a conformally deposited conductive liner may be formed in the openings formed in the ILD 10 (for the contacts 73 and 74 and the local interconnect features). The openings are then completely filled with a conductive fill material deposited over the conductive liner. The liner comprises metals used to help enhance adhesion and is a barrier to out-diffusion of the conductive fill material of contacts 74 into the surrounding dielectric materials. In some embodiments, the liner may comprise one or more metal layers. The conductive liner may additionally include metals such as, TiN, TaN, Ta, or other suitable metals, or their alloys. A conductive fill material (e.g., W, Al, Cu, Ru, Ni, Co, alloys of these, combinations thereof, and the like) may be deposited over the conductive liner layer to fill the contact openings, using any acceptable deposition technique (e.g., CVD, ALD, PEALD, PECVD, PVD, ECP, electroless plating, or the like, or any combination thereof).

In some embodiments, prior to filling the contact openings, a layer of a metal may be deposited conformally which can react with the heavily-doped semiconductor in the source/drain regions 54 exposed at the bottoms of the contact openings. A thermal step may be performed during which the metal may chemically react with the semiconductor to form, for example, metal-silicide regions to help form low resistance ohmic contacts. For example, a metal such as Ti, Ni, Pt, Co, other suitable metals, or their alloys may be used to form a conductive metal silicide in embodiments where the exposed semiconductor is Si or $Si_xGe_{1-x}$. Any unreacted metal may be removed selectively using, for example, a wet chemical etch.

After the deposition of the conductive fill material is completed, a planarization process (e.g., CMP) may be used to remove excess portions of all the conductive materials from over the surface of the $ILD_2$ 78. The resulting conductive plugs embedded in ILD 10 are the contacts 74 illustrated in FIG. 1A. In this example, contacts to electrodes over STI 62 and to electrodes over fins 58 are formed simultaneously using the same processing steps. However, in other embodiments these two types of contacts may be formed separately.

The manufacturing process flow for fabricating a multi-level interconnect system is referred to as the back end of line (BEOL). Any one of several BEOL integration schemes may be adopted depending on the requirements for the integrated circuit design. In the BEOL scheme in this example the contacts 73 and 74 may be used as vertically conducting connectors (see FIG. 1A) and also as local interconnect lines (not shown) formed by laterally extending the contacts 73. In this example, the electrodes of electronic devices formed on the semiconductor substrate (e.g., conductive gates 64 and source/drain regions 54) may be directly connected to $M_0$ lines 88 using the contacts 73 and 74; there are no vertically conducting vias at the $M_0$ level. The interconnect levels formed above $M_0$ (e.g., $M_1$) include both laterally conducting lines (e.g., $M_1$ lines 108) and vertically conducting vias (e.g., $V_1$ 104). It is understood that this BEOL integration scheme is used only as an example. Other embodiments may utilize other BEOL integration schemes. For example, in some other embodiments, the contacts 73 or 74 may be used exclusively as vertical connectors; the local interconnect feature used to connect neighboring FinFETs may be unavailable. In yet some other embodiments, the $M_0$ level may be omitted and the conductive gates 64 and source/drain regions 54 may be directly connected to $V_1$ 104 through the contacts 73 and 74. The inventive features described herein in the context of the example BEOL integration scheme described above with reference to FIG. 1A may be applicable to other embodiments using some other BEOL integration scheme.

The processing steps used in forming the $M_0$ and $M_1$ interconnect levels of the example illustrated in FIG. 1A are described below with reference to FIGS. 2 through 11 illustrating cross-sectional views of the region enclosed by the dashed lines in FIG. 1A at intermediate processing steps. Higher interconnect levels (e.g., $M_2$) may be formed using processes and materials similar to those used to form $M_1$.

Figure 2:
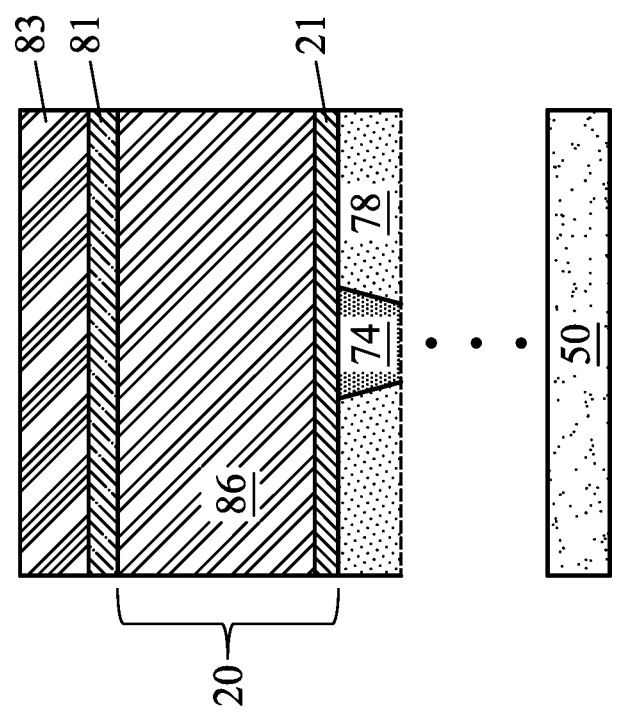
FIGS. 2 through 6 illustrate cross-sectional views of an interconnect level at various intermediate stages of fabrication, in accordance with some embodiments.

FIGS. 2 through 6 illustrate the intermediate processing steps used to form the interconnect level $M_0$ after all processing steps used to form the ILD 10, and the conductive features therein, have been completed. Referring now to FIG. 2, several insulating layers may be deposited over the planarized top surface comprising an insulating portion (e.g., $ILD_2$ 78) and a conductive portion (e.g., gate contacts 73 which include local interconnect features (not shown) and source/drain contacts 74). First, $IMD_0$ 20 is formed by successively forming an ESL 21 and a bulk $IMD_0$ layer 86, in accordance with some embodiments. The etch rate of the dielectrics used in the ESL 21 may be substantially less than the etch rate of the overlying bulk $IMD_0$ layer 86 for etchants used to remove a portion of the bulk $IMD_0$ layer 86 in a subsequent etching step. A plasma surface pre-treatment using, for example, Ar, He, $N_2$, $N_2O$, or the like, may precede the deposition of the ESL 21. During the pre-treatment step, the surface may be exposed to the plasma at an RF power from about 100 W to about 300 W for duration of approximately 3 seconds to 100 seconds. The ESL 21 may comprise one or more insulators, such as SiN, SiCN, SiOC, AlN, AlO, combinations thereof, or the like, of thickness of about 1 nm to about 50 nm, formed using appropriate deposition techniques, such as ALD, PEALD, PECVD, and/or the like, or a combination thereof.

The bulk $IMD_0$ layer 86 may include a low-k dielectric for the advantages in circuit performance, as discussed above. In some embodiments, the low-k dielectric may be formed using a PECVD technique using an RF power of about 50 W to about 2 kW. The deposition may be performed at a temperature from about 50° C. to about 500° C. using gases at a total pressure from about 0.5 Torr to about 20 Torr. The carrier gas may include He, Ar, $H_2$, $N_2$, $N_2O$, or NO, or any combination thereof, with a flow rate from about 1,000 sccm to about 100,000 sccm.

In some embodiments, the low-k dielectric may be formed using a PECVD technique wherein the precursor gases do not include $O_2$ gas. A first precursor gas which contains oxygen, such as TEOS (tetraethylorthosilicate $Si(OC_2H_5)_4$) or MDEOS (also referred to as DEMS diethoxymethylsilane $SiH(CH_3)(OC_2H_5)_2$), may be used to provide the 0 atoms incorporated in the low-k dielectric to form the Si—O bonds. The first precursor may be introduced into the processing chamber at a flow rate from about 50 sccm to about 5000 sccm. A second precursor gas (e.g., propane $C_3H_8$, ATRP (alpha-Terpinene $C_{10}H_{16}$), or BCHD (bicycloheptadiene $C_7H_8$), or $C_6H_{10}(C_2H_5)_2$) containing a hydrocarbon ($C_xH_y$, where x may be from about 3 to about 10, and y may be from about 8 to about 30) may be used in combination with the first precursor gas. The second precursor may be introduced into the processing chamber at a flow rate from about 50 sccm to about 5000 sccm.

In some other embodiments, the precursor gases for the PECVD process may include $O_2$ gas having a flow rate not exceeding 1000 sccm, and the ratio of the $O_2$ flow rate to the sum of the flow rates of all other precursors may not exceed 1:25. In these embodiments, a first precursor gas may include a chemical with embedded Si—O—Si bonds, (e.g., $(CH_3O)_3$—Si—O—Si—$(CH_3O)_3$, or $(CH_3)_3$—Si—O—Si—$(CH_3)_3$), or TEOS, or MDEOS, or a combination thereof. The first precursor may be introduced into the processing chamber at a flow rate from about 50 sccm to about 5000 sccm. A second precursor gas (e.g., propane $C_3H_8$, ATRP (alpha-Terpinene $C_{10}H_{16}$), or BCHD (bicycloheptadiene $C_7H_8$)) containing a hydrocarbon ($C_xH_y$) may be used in combination with the first precursor and the $O_2$ gas. The second precursor may be introduced into the processing chamber at a flow rate from about 50 sccm to about 5000 sccm.

In still other embodiments, the low-k dielectric may be formed using a PEALD or ALD technique. The ALD/PEALD technique utilizes a sequence of process steps whereby one monolayer of material is deposited. Such a sequence is referred to as a reaction cycle, wherein each process step is referred to as a pulse. Multiple reaction cycles are performed till the desired amount of material has been deposited. Each reaction cycle comprises a first reaction pulse using a first precursor and a second reaction pulse using a second precursor, and so on, depending on the number of reaction pulses required. A purge pulse is performed after each reaction pulse to clear the processing chamber of any residual reactants and by-products prior to feeding further reactants into the processing chamber for the next reaction pulse. The purge between two successive reaction pulses may be performed using gases, such as He, Ar, $H_2$, $N_2$, $N_2O$, or NO, or any combination thereof, with a flow rate from about 100 sccm to about 10000 sccm. It is understood that the purge gas used in each purge pulse may be a different purge gas or the same purge gas. For example, if two purge pulses are performed in each reaction cycle then the first purge pulse (performed after the first reaction pulse) may use a first purge gas, and the second purge pulse (performed after the second reaction pulse) may use a second purge gas, the second purge gas may be a different purge gas or the same purge gas the first purge gas. The PEALD process may be performed using an RF power of about 20 W to about 1 kW at a temperature from about 50° C. to about 500° C. The minimum temperature for the ALD/PEALD technique is about 200° C. The total pressure during the PEALD/ALD deposition process may be from about 0.1 Torr to about 10 Torr.

In some embodiments, the precursor gases do not include $O_2$ gas to form the low-k dielectric using the PEALD/ALD technique. The first precursor for the first reaction pulse may include a gas which contains oxygen, such as TEOS (tetraethylorthosilicate $Si(OC_2H_5)_4$) or MDEOS (also referred to as DEMS diethoxymethylsilane $SiH(CH_3)(OC_2H_5)_2$). The first precursor may be introduced into the processing chamber at a flow rate from about 10 sccm to about 1000 sccm. The second precursor (e.g., propane $C_3H_8$, ATRP (alpha-Terpinene $C_{10}H_{16}$), or BCHD (bicycloheptadiene $C_7H_8$)) for the second reaction pulse may include a gas containing a hydrocarbon ($C_xH_y$). The second precursor may be introduced into the processing chamber at a flow rate from about 10 sccm to about 1000 sccm. In this example, two reaction pulses are used sequentially in each cycle, with each reaction pulse followed by a purge pulse.

In some other embodiments, the precursor gases for the PEALD/ALD process may include $O_2$ gas having a flow rate not exceeding 1000 sccm. Accordingly, the first precursor for the first reaction pulse may be $O_2$ gas, or a combination of $O_2$ gas and TEOS or MDEOS. The second precursor for the second reaction pulse may include a chemical with embedded Si—O—Si bonds, (e.g., $(CH_3O)_3$—Si—O—Si—$(CH_3O)_3$, or $(CH_3)_3$—Si—O—Si—$(CH_3)_3$), or 3MS (trimethylsilane SiH$(CH_3)_3$), or 4MS (tetramethylsilane Si$(CH_3)_4$), or SiH$_3$[N$(C_3H_7)$], or SiH$_2$[N$(C_2H_5)_2$]$_2$. The second precursor may be introduced into the processing chamber at a flow rate from about 10 sccm to about 1000 sccm. The third precursor (e.g., propane $C_3H_8$, ATRP (alpha-Terpinene $C_{10}H_{16}$), or BCHD (bicycloheptadiene $C_7H_8$)) for the third reaction pulse may include a gas containing a hydrocarbon ($C_xH_y$). The third precursor may be introduced into the processing chamber at a flow rate from about 10 sccm to about 1000 sccm. In this example, three reaction pulses are used sequentially in each PEALD/ALD reaction cycle, with each reaction pulse followed by a purge pulse. For example, the introducing the precursors is performed sequentially, such as the introducing the gaseous oxygen, the introducing the $(CH_3)_3$—Si—O—Si—$(CH_3)_3$ gas, and the introducing the propane gas may be performed sequentially during respective reaction pulses in each reaction cycle, in accordance with some embodiment.

After the deposition process is completed, the deposited low-k dielectric for the bulk $IMD_0$ layer 86 may be cured by exposing the material to ultra-violet (UV) radiation of wavelength from about 150 nm to about 400 nm for a maximum time of about 1000 seconds. The ambient gas may include Ar, He, $N_2$, $N_2O$, NO, CO, $CO_2$ or the like, or a combination thereof, at a temperature of about 200° C. to about 500° C., and a pressure of about 1 Torr to about 50 Torr. The UV-cured low-k dielectric for the bulk $IMD_0$ layer 86 may undergo either a thermal treatment or a plasma treatment performed in an ambient gas (e.g., Ar, He, $N_2$, $N_2O$, $H_2$, CO, $CO_2$ or the like, or a combination thereof) containing one or more additives, such as, $SiH_4$, $Si_2H_6$, 3MS, 4MS, MDEOS, and/or the like. The thermal treatment may be done for a duration not exceeding 1000 seconds at a temperature of about 200° C. to about 500° C. and a pressure of about 0.5 Torr to about 20 Torr. The plasma treatment may be done for a duration not exceeding 200 seconds at a temperature of about 50° C. to about 500° C. and a pressure of about 0.1 Torr to about 20 Torr, using an RF power of about 50 W to about 2 kW.

The low-k dielectric material formed using the deposition processes described above may have a low value of dielectric constant (k) of about 2.9 to about 3.2. The mechanical strength of the IMD dielectrics, as characterized by the material's Young's modulus, has to be sufficiently high to endure the mechanical stresses during processing, without excessive deformation (e.g., cracking and delamination). Mechanical stresses may be generated, for example, during a planarization step caused by the down force exerted by a CMP polishing pad, or at the interfaces of adjacent materials during thermal treatments caused by differences in coefficients of thermal expansion). The Young's modulus of the low-k dielectric manufactured using the deposition processes described above may be from about 3 GPa to about 5 GPa. The low-k dielectric material used to form the bulk $IMD_0$ layer 86 may be a derivative of silicon oxide. About 83% to about 95% of all the chemical bonds formed in the low-k dielectric produced by the deposition processes described above may be Si—O bonds and about 5% to about 17% may be Si—$CH_3$ bonds. In addition, there may be a small number (from about 0.5% to about 3%) of Si—C—Si bonds in the low-k dielectric matrix. The composition of bonds formed in the low-k dielectric material gives certain advantages as discussed in greater detail below.

Figure 3:
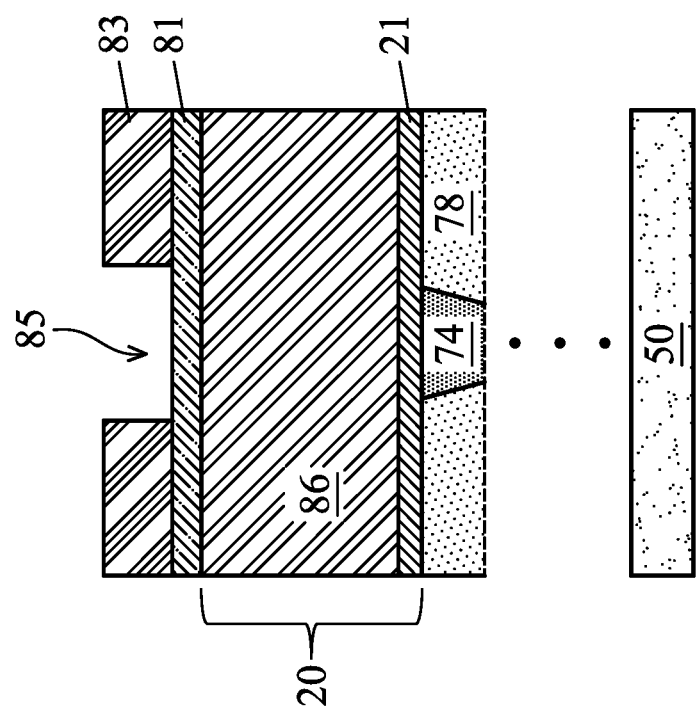
Figure 4:
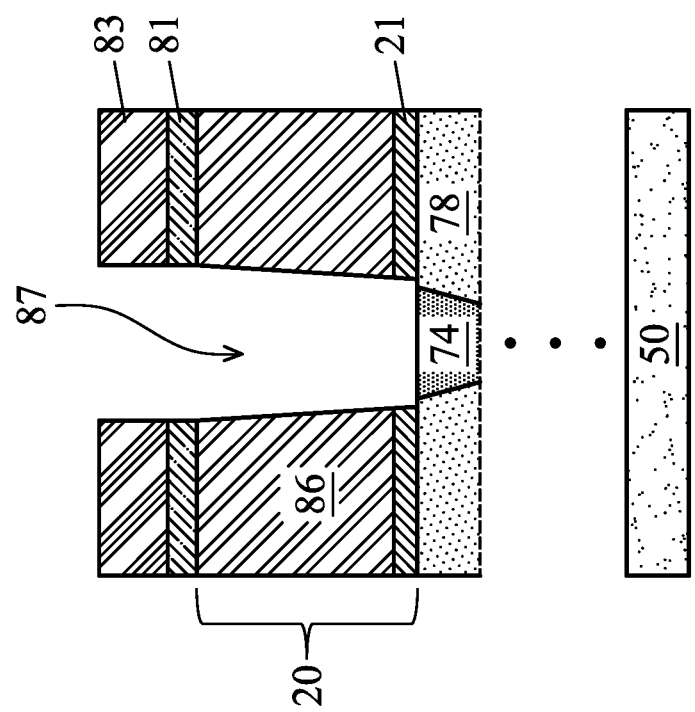

In some embodiments, one or more sacrificial hard mask layers may be formed over the bulk $IMD_0$ layer 86. In FIG. 2, a first sacrificial hard mask layer 81 and a second sacrificial hard mask layer 83 are shown formed over the bulk $IMD_0$ layer 86. The sacrificial hard mask layers 81 and 83 may comprise materials that can be etched selective to silicon oxide (e.g., $Si_3N_4$, SiC, SiCN, SiOC, AlN, TiN, and the like). A patterned photoresist mask may be used to form openings 85 in the second sacrificial hard mask layer 83, as illustrated in FIG. 3. In FIG. 4, the patterned second sacrificial hard mask layer 83 may be used to remove portions of the first sacrificial hard mask layer 81 and portions of the $IMD_0$ layer 20 to form openings 87. A multi-step etching technique using, for example, anisotropic RIE may be utilized, wherein the etching step used to remove portions of the bulk $IMD_0$ layer 86 terminates once a top surface of the etch stop layer 21 has been exposed. Then, the etchants may be switched to remove the etch stop layer 21 to expose a portion of the surface of the conductive feature below, for example, the contact 74 in FIG. 4.

Figure 5:
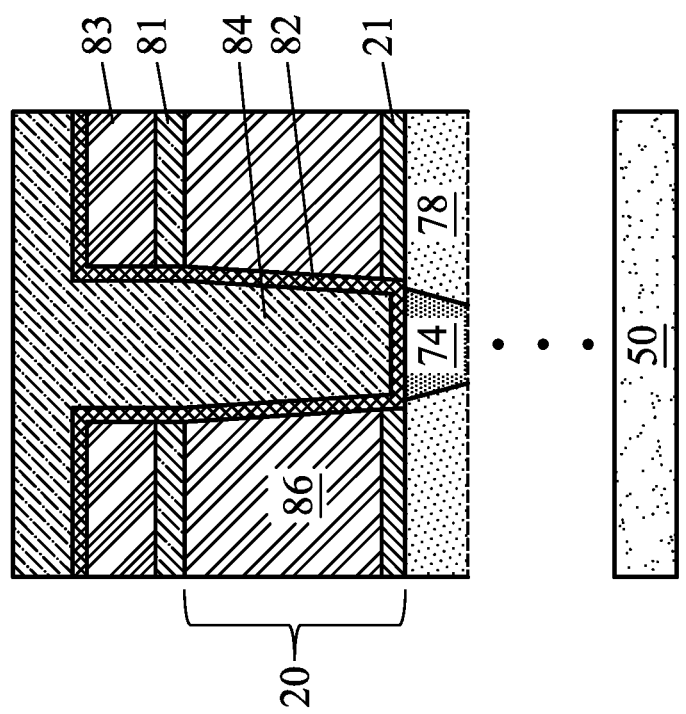

FIG. 5 illustrates the openings 87 (see FIG. 4) filled with conductive materials. The openings may be conformally lined with a conductive diffusion barrier layer 82 and then completely filled with a conductive fill layer 84 deposited over the conductive diffusion barrier layer 82. The conductive diffusion barrier layer 82 blocks/obstructs material from the conductive fill layer 84 to diffuse out into the $IMD_0$ 20. In some embodiments, a thin conductive seed layer (not shown) may be deposited over the conductive diffusion barrier layer 82 to help initiate an ECP deposition step that may be used to completely fill the openings 87 with the conductive material of conductive fill layer 84. In some embodiments, the conductive seed layer may be of the same conductive material as the conductive fill layer. The conductive diffusion barrier layer 82 may comprise one or more layers of TaN, Ta, TiN, Ti, Co, or the like, or combinations thereof, and the conductive fill layer 84 may comprise metals such as Cu, Al, W, Co, Ru, or the like, or combinations thereof. The conductive materials used in the layers 82 and 84 may be deposited by any suitable method, for example, CVD, PECVD, PVD, ALD, PEALD, ECP, electroless plating and the like.

Figure 6:
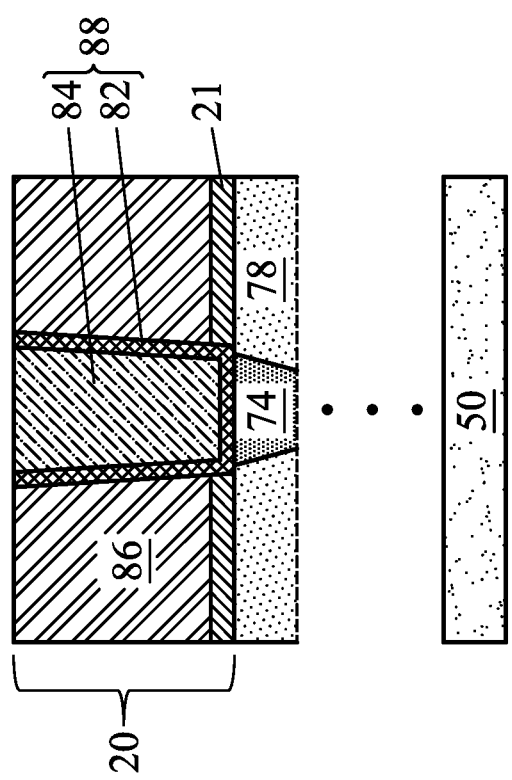

As illustrated in FIG. 6, any excess conductive material over the second sacrificial hard mask layer 83 outside of the openings 87 (see FIGS. 4 and 5) may be removed by a planarizing process (e.g., CMP). The same planarizing process step may be further utilized to remove the sacrificial hard mask layers 81 and 83 (seen in FIG. 5), thereby forming a top surface comprising dielectric regions of $IMD_0$ 20 that are substantially coplanar, within process variations, with conductive regions of the conductive diffusion barrier layer 82 and the conductive fill layer 84. The conductive layers 82 and 84 collectively form a $M_0$ line 88 embedded in $IMD_0$, as illustrated in FIG. 6, and the $M_0$ lines 88 shown in FIG. 1A.

Figure 7:
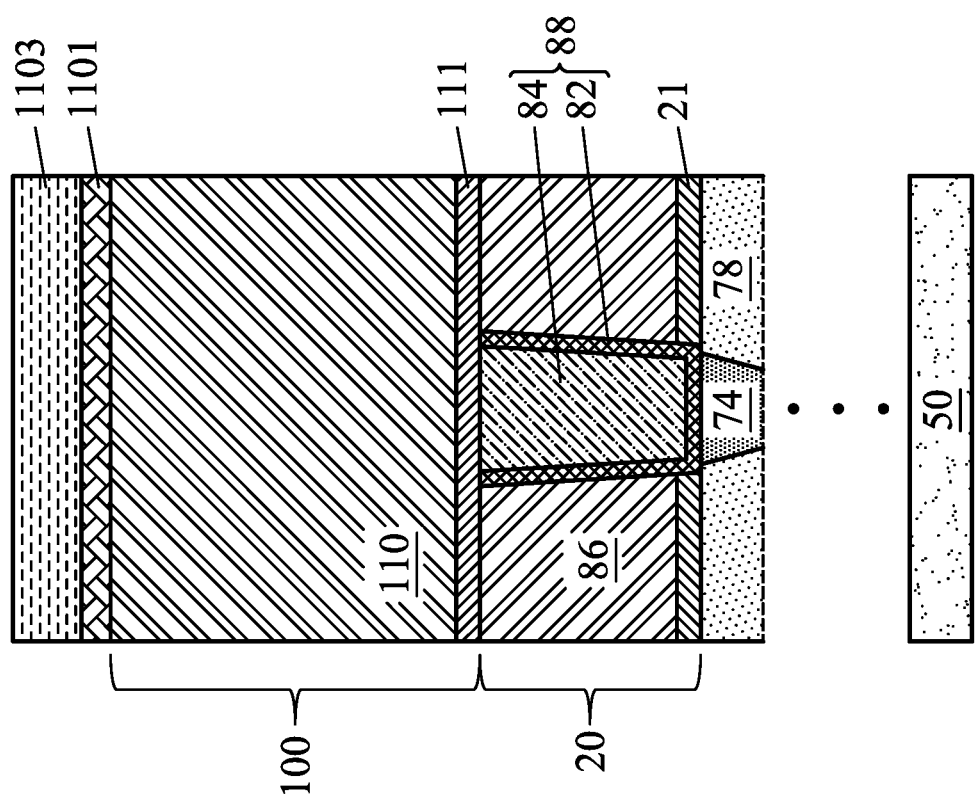
FIGS. 7 through 11 illustrate cross-sectional views of an interconnect level at various intermediate stages of fabrication, in accordance with some embodiments.
Figure 8:
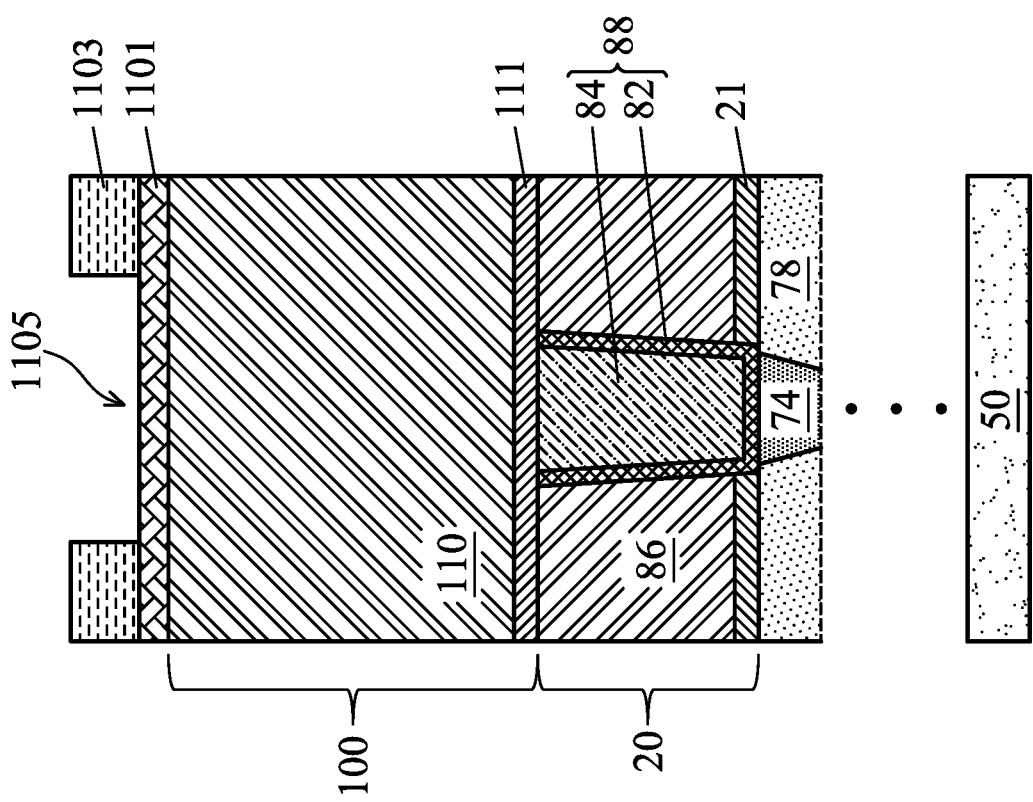

FIGS. 7 through 11 illustrate the intermediate processing steps used to form the interconnect level $M_1$. FIG. 7 illustrates the $IMD_1$ 100 comprising an ESL 111 and a bulk $IMD_1$ layer 110, a first sacrificial hard mask layer 1101, and a second sacrificial hard mask layer 1103. The processes and materials used to form these layers may be the same as those described with reference to FIG. 2 for forming the $M_0$ interconnect level. In FIG. 8 the second sacrificial hardmask layer 1103 has been patterned to form openings 1105 using similar photolithography and etching techniques as those in the corresponding steps used to pattern the sacrificial hard mask layer 83, as described with reference to FIG. 3.

Figure 9:
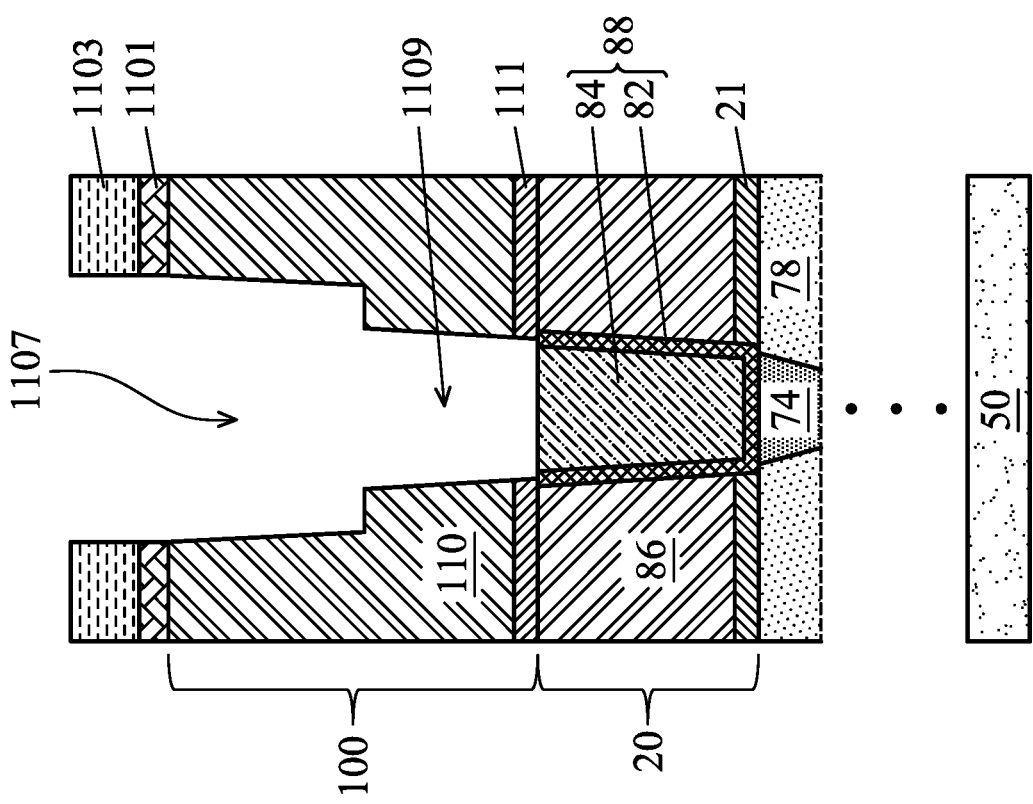

Referring now to FIG. 9, appropriate photolithography and etching techniques (e.g., anisotropic RIE employing fluorocarbon chemistry) may be used to pattern the $IMD_1$ layer 100 to form openings for vias and lines. The openings for vias may be vertical holes extending through $IMD_1$ layer 100 (e.g., the hole 1109 shown in FIG. 9) to expose a top conductive surface of the $M_0$ line 88. Openings for lines may be longitudinal trenches (e.g., the trench 1107 in FIG. 9) formed in an upper portion of the $IMD_1$ layer 100. In some embodiments, the method used to pattern the holes 1109 and the trenches 1107 in $IMD_1$ 100 utilizes a via-first scheme, wherein a first patterned mask (e.g., a photoresist mask) may be used to etch the holes 1109 for vias $V_1$ 104 (see FIG. 1A). A multi-step etching technique may be used, similar to the etch process used to form openings 87, as described above with reference to FIG. 4. A second patterned mask (e.g., patterned sacrificial second hard mask 1103) may be used to etch the trenches 1107 for $M_1$ lines 108 (see FIG. 1A). Other embodiments may use a different method, for example, a trench-first scheme, or an incomplete via-first scheme, or a buried etch stop layer scheme.

Figure 10:
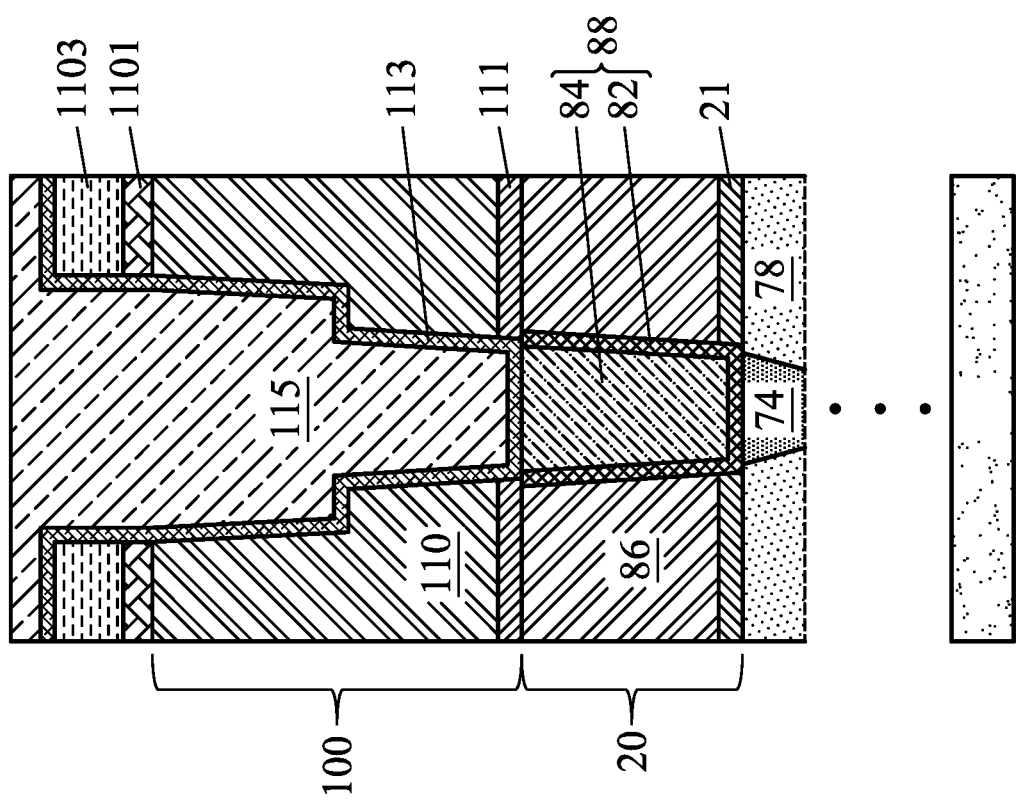

FIG. 10 illustrates the openings 1107 and 1109 (see FIG. 9) conformally lined with a conductive diffusion barrier layer 113 and completely filled with a conductive fill layer 115 deposited over the conductive diffusion barrier layer 113. The processes and materials used to form the conductive diffusion barrier layer 113 and the conductive fill layer 115 are similar to those used to form the conductive diffusion barrier layer 82 and the conductive fill layer 84, as described above with reference to FIG. 5.

Figure 11:
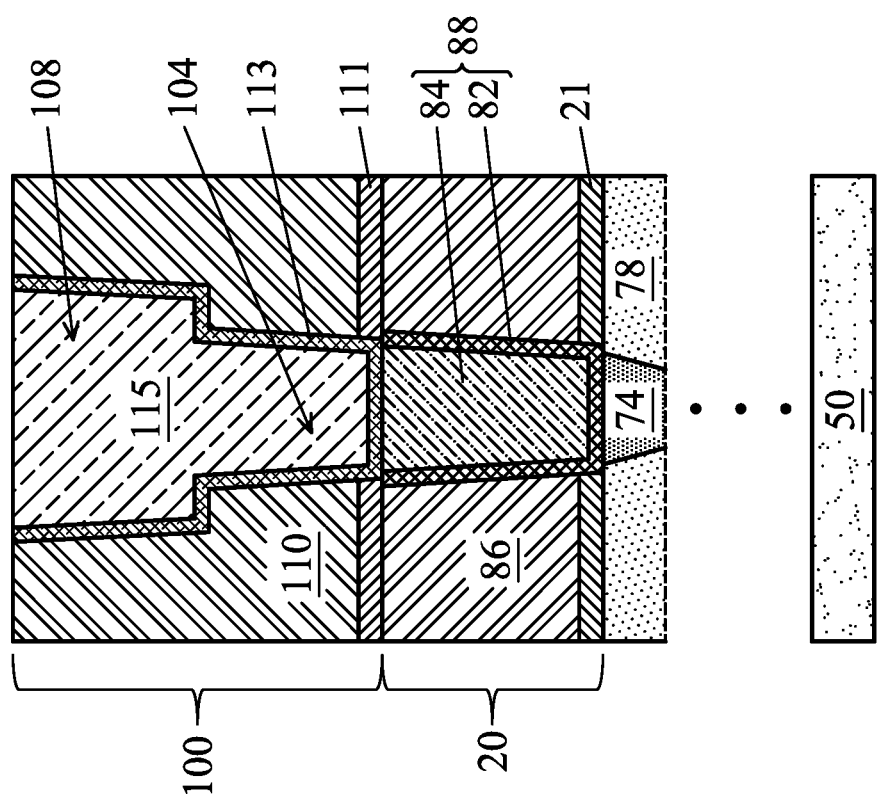

In FIG. 11 a planarization step has been performed, similar to that described above with reference to FIG. 6 in the context of forming the interconnect level $M_0$. Any excess conductive material over the $IMD_1$ 100 and the sacrificial hard mask layers 1101 and 1103 may be removed during the planarizing step, thereby forming a substantially planar (within process variations) top surface comprising dielectric regions of $IMD_1$ 100 and conductive regions comprising portions of the conductive diffusion barrier layer 113 and the conductive fill layer 115. The planarization step forms a conductive via $V_1$ 104 and a conductive $M_1$ line 108 embedded in $IMD_1$ 100, as illustrated in FIG. 11, and the conductive vias $V_1$ 104 and the conductive $M_1$ lines 108 shown in FIG. 1A.

Figure 12:
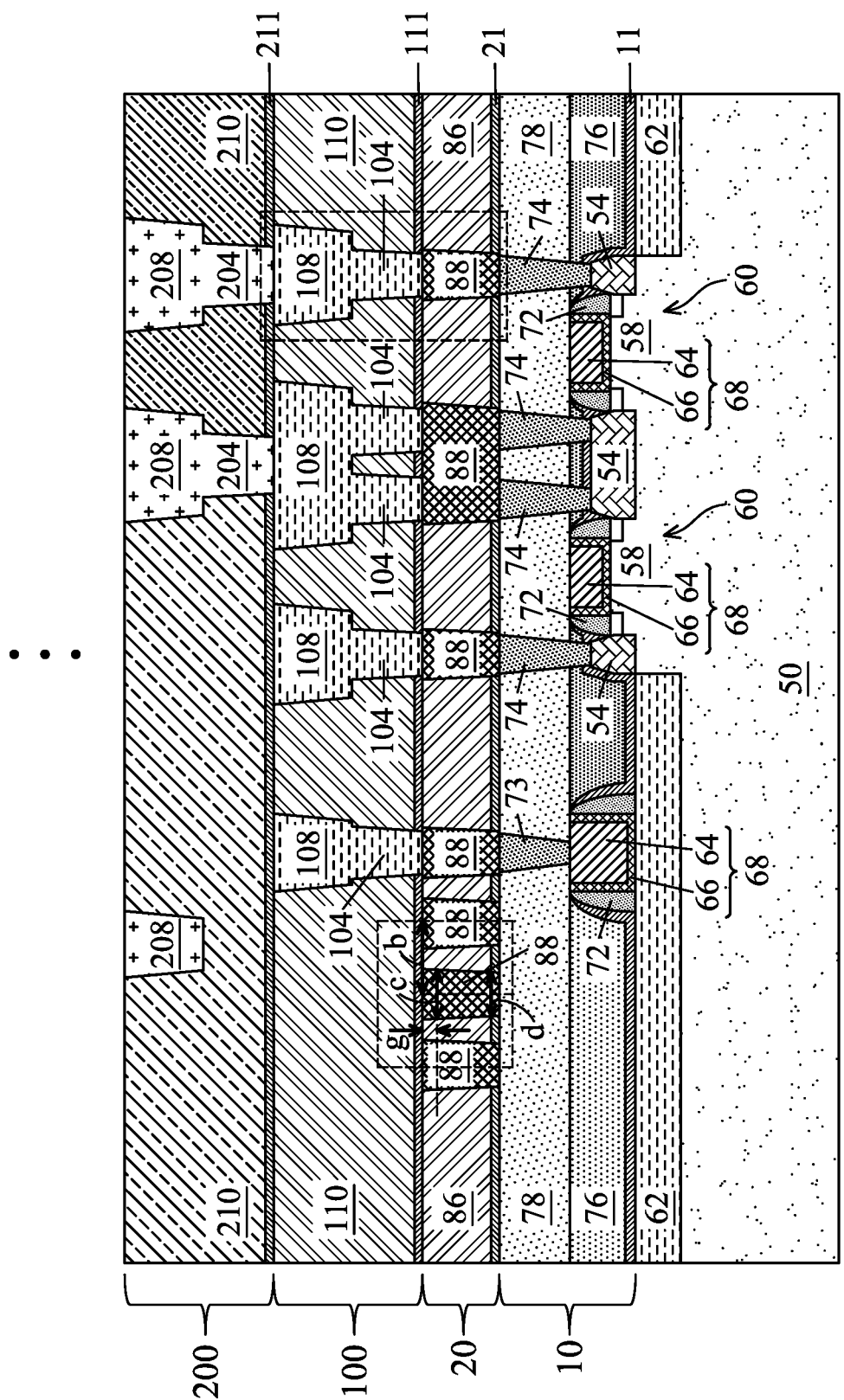
FIGS. 12 and 13 illustrate a cross-sectional view of a semiconductor substrate and multilevel interconnect structures of an integrated circuit, in accordance with some embodiments.
Figure 13:
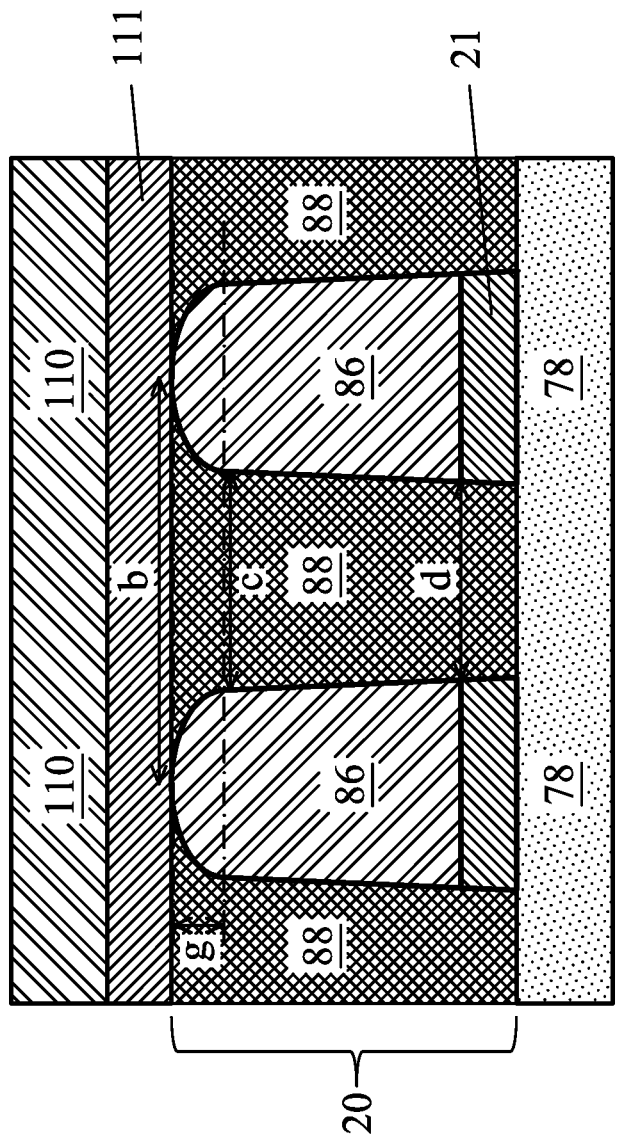

The geometry of the conductive features inlaid in the IMD layers may depend on the interaction of the low-k dielectric material with the etch processes (e.g., the anisotropic RIE) used to remove portions of the dielectric layers used to form the respective IMD layer. In FIG. 12, the geometry of conductive features in a region of densely packed $M_0$ lines 88 (indicated by a dashed rectangle) are described with reference to dimensions marked by the letters 'b', 'c', 'd' and 'g'. A magnified view of this region is shown in FIG. 13. In FIGS. 12 and 13, b denotes the minimum pitch allowed at the $M_0$ level and may be from about 24 nm to about 30 nm. As illustrated in FIG. 13, the $M_0$ lines 88 have a flair resulting from the edges of the trenches for $M_0$ lines spreading outwards near the top. One consequence of the flair shape is that the top surface of the low-k dielectric bulk $IMD_0$ layer 86 in between the dense $M_0$ lines 88 may be formed slightly convex. The curved surface of the low-k dielectric bulk $IMD_0$ layer 86 may extend from its peak height (occurring midway between adjacent $M_0$ lines 88) to a small depth indicated by g in FIG. 12 which may be from about 0.2 nm to about 1.8 nm. The top-linewidth of an $M_0$ line, as defined at a height near the top where the edge is straight, is indicated in FIG. 13 by the dimension c which may be from about 21 nm to about 29 nm. The linewidth of the low-k dielectric bulk $IMD_0$ layer 86 is the space between adjacent $M_0$ lines given by (b–c), and may be from about 1 nm to about 3 nm, in accordance with some embodiments. The curvature of the surface of the low-k dielectric bulk $IMD_0$ layer 86 may be characterized by the ratio of g to half the space between adjacent $M_0$ lines 88, (g:(b–c)/2). A smaller ratio indicates a flatter surface. This ratio may be from about 0.4 to about 1.2, in accordance with some embodiments, indicating a relatively small curvature. The trench edges may be formed close to vertical with a sidewall angle from about 800 to about 90°. Accordingly, the bottom-linewidth d of the $M_0$ line, as defined near the interface between the low-k dielectric bulk $IMD_0$ layer 86 and the ESL 21 close to the bottom of the $M_0$ line, is about the same as its top-linewidth c, as illustrated in FIG. 13. The bottom-linewidth may be from about 23 nm to about 31 nm. As also illustrated in FIG. 13, there may be almost no undercut of the ESL 21, resulting in the edges having a smooth, kink-free profile.

The low-k dielectric used in the bulk IMD layers (e.g., the bulk $IMD_0$ layer 86) may be exposed to chemical and physical stresses during processing steps used to form the conductive features of the respective interconnect level, such as anisotropic RIE with energetic ions, or damascening conductive materials deposited in openings in the low-k dielectric using CMP pads. The damage to the low-k dielectric may compromise the structural integrity of the inlaid features. For example, kinks may be observed in the sidewall of conductive features at the interfaces between the low-k bulk IMD layers and the respective ESL below the bulk IMD layer. The smooth kink-free profile at the interface between the low-k dielectric bulk $IMD_0$ layer 86 and the ESL 21 mentioned above indicates that the composition of the low-k dielectric in the embodiments described herein may provide the advantage of being less vulnerable to process damage. Accordingly, the manufacturing yield and long-term reliability (e.g., time-dependent dielectric breakdown (TDDB)) of integrated circuit devices fabricated using the low-k dielectrics may be improved.

Figure 14:
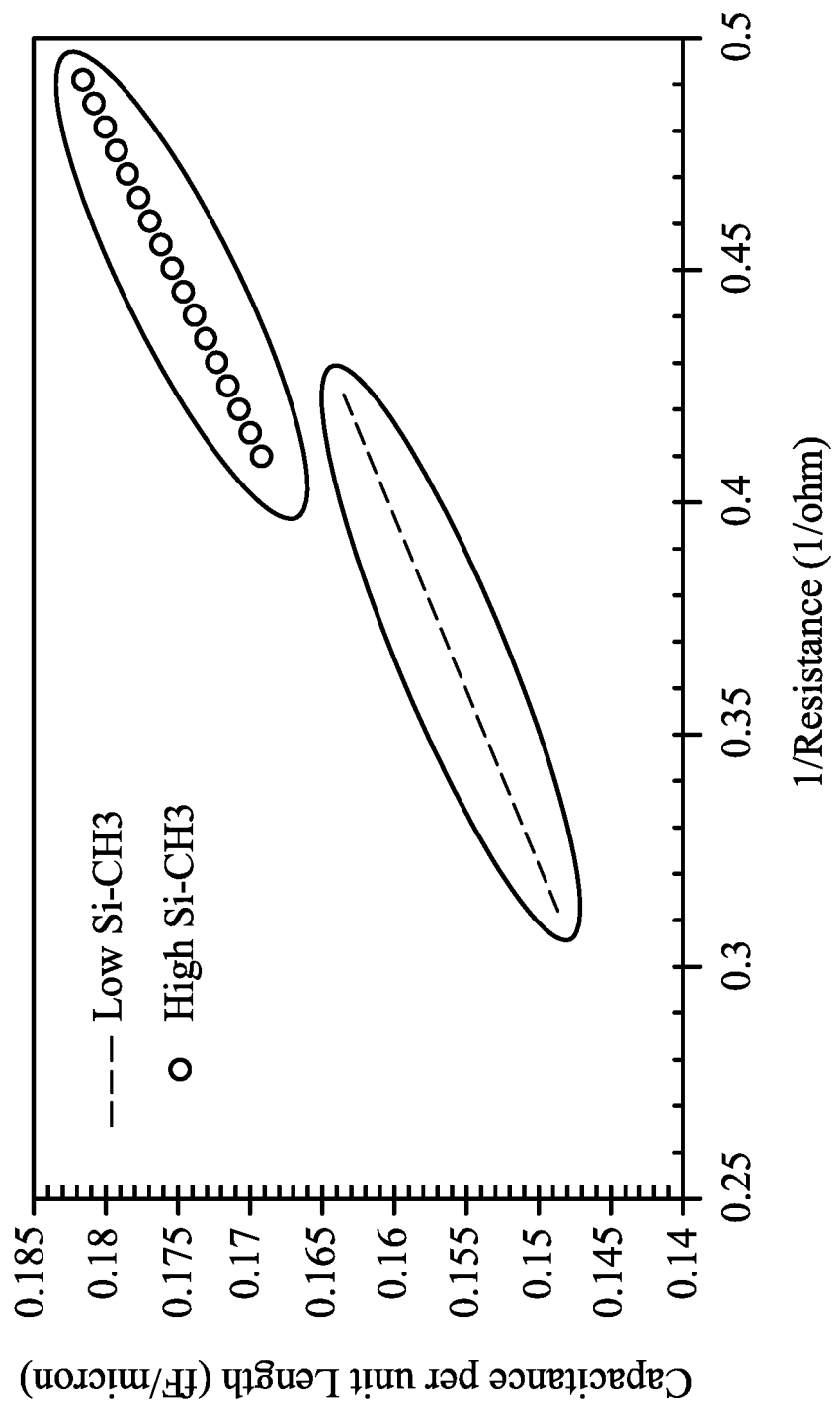
FIG. 14 illustrates the impact of the content of Si—$CH_3$ bonds in intermetal dielectrics on the normalized line-to-line capacitance versus conductance (1/resistance) characteristics of densely packed metal lines, in accordance with some embodiments.

Process-induced damage to the low-k dielectric may also increase the dielectric constant (the value of k). As discussed above, a low value of k increases the bandwidth available to transmit high-speed signals over closely spaced long lines by reducing the line-to-line capacitance of, densely packed, long metal lines. The increase in k may be a result of Si—$CH_3$ bonds being broken by energetic ions during the anisotropic RIE process used to remove a portion of the IMD dielectric layers during intermediate process steps, as described above. FIG. 14 compares the normalized line-to-line capacitance per unit length, C, as a function of the conductance (1/Resistance) of several closely spaced $M_0$ lines. The electrical measurements were made using two groups of integrated circuits. One group was fabricated using low-k dielectric materials incorporated into the IMD layers in accordance with the embodiments described in this disclosure. For the other group, the respective low-k dielectric materials incorporated into the IMD layers were formed using deposition process parameters that were modified to significantly increase the proportion of Si—$CH_3$ bonds in the low-k dielectric materials. Both the groups have substantially the same measured k-value (within measurement inaccuracies), as measured from low-k dielectric films deposited over unpatterned bulk silicon wafers. The dashed line indicated as "Low Si—$CH_3$" in the legend of FIG. 14 refers to devices formed using the embodiments of low-k dielectric materials described in this disclosure. The circular symbols indicated as "High Si—$CH_3$" in the legend of FIG. 14 refers to data from the group with the modified composition having a higher proportion of Si—$CH_3$ bonds in the low-k dielectric materials. It is observed that C is lower for a fixed value of conductance (1/Resistance). This indicates that the composition of the low-k dielectric in the embodiments described herein may provide the advantage of improving the performance of integrated circuits fabricated using the low-k dielectrics and methods of forming the same, as described in this disclosure.

In an embodiment, a method of forming a semiconductor structure includes forming a conductive element within a dielectric layer over a substrate; depositing a dielectric material over the conductive element, the depositing the dielectric material includes, placing the substrate into a processing chamber; introducing a first precursor to the processing chamber, the first precursor includes silicon atoms and oxygen atoms; and introducing a second precursor to the processing chamber to react and form the dielectric material, the second precursor including a hydrocarbon group, wherein the depositing the dielectric material is performed without gaseous oxygen; removing a portion of the dielectric material to expose the conductive element; and forming a contact to the conductive element through the dielectric material. In an embodiment, the depositing the dielectric material is performed at least in part with a chemical vapor deposition process. In an embodiment, the depositing the dielectric material is performed at least in part with an atomic layer deposition process. In an embodiment, the first precursor comprises TEOS. In an embodiment, the CH group comprises propane. In an embodiment, after the forming the contact the dielectric material has a top surface with a curvature greater than zero. In an embodiment, wherein about 83% to about 95% of chemical bonds formed in the dielectric material are Si—O bonds and about 5% to about 17% of chemical bonds are Si—$CH_3$ bonds.

In an embodiment, a method of manufacturing a semiconductor device includes forming a dielectric material over a conductive element over a substrate, the forming the dielectric material includes placing the substrate into a processing chamber; introducing gaseous oxygen to the processing chamber; introducing a first precursor to the processing chamber, the first precursor includes embedded silicon-oxygen-silicon bonds; and introducing a second precursor to the processing chamber, the second precursor includes a CH group; and forming a contact through the dielectric material to the conductive element. In an embodiment, the second precursor includes bicycloheptadiene. In an embodiment, a first flow rate of the oxygen is less than 1000 sccm. In an embodiment, the introducing gaseous oxygen, the introducing the first precursor, and the introducing the second precursor are performed sequentially. In an embodiment, the introducing gaseous oxygen, the introducing the first precursor, and the introducing the second precursor are performed simultaneously. In an embodiment, the ratio of a first flow rate of the oxygen to the sum of a first flow rate of the first precursor and a first flow rate of the second precursor is less than 1:25. In an embodiment, about 83% to about 95% of chemical bonds formed in the dielectric material are Si—O bonds and about 5% to about 17% of the chemical bonds are Si—$CH_3$ bonds.

In an embodiment, a method of manufacturing a semiconductor device includes forming a dielectric material over a conductive element over a substrate, wherein the dielectric material is a derivative of silicon oxide; and the forming the dielectric material includes placing the substrate into a processing chamber; and performing an atomic layer deposition process, the performing the atomic layer deposition process includes performing one or more reaction cycles, wherein the performing of each reaction cycle includes performing a succession of three pairs of alternating reaction and purge pulses, the succession of three pairs of alternating reaction and purge pulses includes introducing a first precursor to the processing chamber during a first reaction pulse, the first precursor includes gaseous oxygen; and after completing the first reaction pulse, introducing a first purge gas during a first purge pulse; and after completing the first purge pulse, introducing a second precursor to the processing chamber during a second reaction pulse, the second precursor includes embedded silicon-oxygen-silicon bonds; and after completing the second reaction pulse, introducing a second purge gas during a second purge pulse; and after completing the second purge pulse, introducing a third precursor to the processing chamber, the third precursor includes a hydrocarbon; and after completing the third reaction pulse, introducing a third purge gas during a third purge pulse; and after completing forming the dielectric material, forming a contact through the dielectric material to the conductive element. In an embodiment, the forming the dielectric material forms the dielectric material with a Young's modulus between about 3 GPa and about 5 GPa. In an embodiment, the forming the dielectric material forms the dielectric material with a dielectric constant between 2.9 and 3.2. In an embodiment, the second precursor includes $(CH_3O)_3$—Si—O—Si—$(CH_3O)_3$. In an embodiment, the second precursor includes $(CH_3)_3$—Si—O—Si—$(CH_3)_3$. In an embodiment, the atomic layer deposition reaction cycle includes at least one plasma-enhanced atomic layer reaction pulse.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A method of forming a semiconductor structure, the method comprising:
   forming a conductive element within a dielectric layer over a substrate;
   depositing a dielectric material over the conductive element, the depositing the dielectric material comprising:
      placing the substrate into a processing chamber;
      introducing a first precursor to the processing chamber, the first precursor comprising silicon atoms and oxygen atoms, the first precursor being an open-chain molecule, wherein each silicon atom is bonded to an oxygen atom, a hydrogen atom, or a methyl group; and
      introducing a second precursor to the processing chamber to react and form the dielectric material, the second precursor comprising a hydrocarbon, wherein the depositing the dielectric material is performed without gaseous oxygen;

removing a portion of the dielectric material to expose the conductive element; and forming a contact to the conductive element through the dielectric material, wherein after the forming the contact the dielectric material has a convex top surface.

2. The method of claim 1, wherein the depositing the dielectric material is performed at least in part with a chemical vapor deposition process.

3. The method of claim 1, wherein the depositing the dielectric material is performed at least in part with an atomic layer deposition process.

4. The method of claim 1, wherein the first precursor comprises TEOS.

5. The method of claim 1, wherein the second precursor comprises propane.

6. The method of claim 1, wherein the second precursor comprises alpha-Terpinene.

7. The method of claim 1, wherein about 83% to about 95% of chemical bonds formed in the dielectric material are Si—O bonds and about 5% to about 17% of chemical bonds are Si—$CH_3$ bonds.

8. A method of manufacturing a semiconductor device, the method comprising:

depositing a dielectric material over a conductive element over a semiconductor substrate, the depositing the dielectric material comprising:
pulsing a first precursor over the semiconductor substrate, the first precursor being acyclic and comprising silicon and oxygen, wherein each silicon atom within the first precursor is bonded to one of an oxygen atom, a hydrogen atom, or a methyl group;
purging the first precursor; and
pulsing a second precursor over the semiconductor substrate after the purging the first precursor, the second precursor comprising a hydrocarbon, wherein during the depositing the dielectric material no gaseous oxygen is pulsed over the semiconductor substrate; and forming a conductive contact through the dielectric material, wherein the dielectric material has a curved surface extending from a peak height to a first depth, the first depth between about 0.2 nm and about 1.8 nm.

9. The method of claim 8, wherein the second precursor comprises bicycloheptadiene.

10. The method of claim 8, wherein the second precursor comprises propane.

11. The method of claim 8, wherein the second precursor comprises alpha-terpinene.

12. The method of claim 8, further comprising curing the dielectric material.

13. The method of claim 12, wherein the curing is performed at least in part with an ultra-violet radiation.

14. The method of claim 8, wherein about 83% to about 95% of chemical bonds formed in the dielectric material are Si—O bonds and about 5% to about 17% of the chemical bonds are Si—$CH_3$ bonds.

15. A method of manufacturing a semiconductor device, the method comprising:

using a gaseous oxygen-free atomic layer deposition process to deposit an oxygen containing dielectric material over a semiconductor substrate, the gaseous oxygen-free atomic layer deposition process using a first precursor and a second precursor, the first precursor being an open-chain compound comprising silicon and oxygen, wherein each silicon atom is bonded to an oxygen atom, a hydrogen atom, or a methyl group, the second precursor comprising a hydrocarbon; and forming a conductive contact through the dielectric material, wherein after the forming the conductive contact the oxygen containing dielectric material a ratio of a first curvature of the oxygen containing dielectric material to half a distance between conductive lines is between about 0.4 and about 1.2.

16. The method of claim 15, wherein the using a gaseous oxygen-free atomic layer deposition process to deposit an oxygen containing dielectric material forms the dielectric material with a Young's modulus between about 3 GPa and about 5 GPa.

17. The method of claim 15, wherein the using a gaseous oxygen-free atomic layer deposition process to deposit an oxygen containing dielectric material forms the dielectric material with a dielectric constant between 2.9 and 3.2.

18. The method of claim 15, wherein the first precursor comprises TEOS.

19. The method of claim 15, wherein the first precursor comprises MDEOS.

20. The method of claim 15, wherein the gaseous oxygen-free atomic layer deposition process includes at least one plasma-enhanced atomic layer reaction pulse.

* * * * *